(12) United States Patent
Mura et al.

(10) Patent No.: US 12,176,854 B2
(45) Date of Patent: Dec. 24, 2024

(54) COMMUNICATION DEVICE HAVING POWER AMPLIFICATION FOR MULTIPLE TRANSMIT UPLINKS

(71) Applicant: MOTOROLA MOBILITY LLC, Wilmington, DE (US)

(72) Inventors: John R Mura, Clarendon Hills, IL (US); Armin W Klomsdorf, Chicago, IL (US)

(73) Assignee: Motorola Mobility LLC, Chicago, IL (US)

(*) Notice: Subject to any disclaimer, the term of this patent is extended or adjusted under 35 U.S.C. 154(b) by 497 days.

(21) Appl. No.: 17/669,167

(22) Filed: Feb. 10, 2022

(65) Prior Publication Data
US 2023/0308054 A1 Sep. 28, 2023

(51) Int. Cl.
*H03F 1/02* (2006.01)
*H03F 3/24* (2006.01)
*H04B 1/04* (2006.01)
*H02J 7/00* (2006.01)

(52) U.S. Cl.
CPC .......... *H03F 1/0238* (2013.01); *H03F 3/245* (2013.01); *H04B 1/04* (2013.01); *H02J 7/0063* (2013.01); *H03F 2200/105* (2013.01); *H04B 2001/045* (2013.01)

(58) Field of Classification Search
CPC .. H03F 1/0238; H03F 3/245; H03F 2200/105; H03F 1/025; H03F 3/24; H03F 2200/451; H04B 1/04; H04B 2001/045; H02J 7/0063
USPC ...................................... 330/297, 124 R, 295
See application file for complete search history.

(56) References Cited

U.S. PATENT DOCUMENTS 9,515,622 B2 * 12/2016 Nentwig ............... H03F 1/0277
9,954,436 B2 * 4/2018 Khlat ...................... H02M 3/07
11,139,780 B2 * 10/2021 Khlat ...................... H03F 3/245

* cited by examiner

*Primary Examiner* — Hieu P Nguyen
(74) *Attorney, Agent, or Firm* — Isidore PLLC

(57) ABSTRACT

A communication device, method and computer program product provide efficient average power tracking (APT) powering of transmit power amplifiers with fewer switching mode power supplies (SMPSs) to reduce size and cost of the communication device. A controller of the communication device detects an output voltage level of a battery supply of a communication device power amplifiers (PAs) assignable to respective transmit uplinks. The communication device includes a smaller second number of switching mode power supplies (SMPSs). The communication device includes linear regulator(s) that are powered by one of (i) output voltage of the battery supply and (ii) one of the one or more SMPSs. Controller selects a combination of SMPSs and linear regulators to power active PAs. The controller determines APT supply voltage value for each PAs and assigns the SMPS(s) and the linear regulator(s) to the PAs to achieve a highest overall or combined system power efficiency.

20 Claims, 11 Drawing Sheets

COMMUNICATION DEVICE HAVING POWER AMPLIFICATION FOR MULTIPLE TRANSMIT UPLINKS

BACKGROUND

1. Technical Field

The present disclosure relates generally to a communication device that supports simultaneous transmissions, and more particularly to a communication device that manages power supplied to a power amplifier for efficient simultaneous transmissions.

2. Description of the Related Art

The cellular industry has widely deployed capability to support up to two simultaneous transmissions from a communication device, either in the same band or in different frequency bands. The communication device, such as a handset, amplifies each transmission signal for transmission with a respective power amplifier (PA). PAs use various efficiency enhancement techniques to improve the power amplifier performance.

Developments in communication devices increasingly include at least partially concurrent transmissions. For example, in moving from fourth generation long term evolved (LTE) radio access technology (RAT) to fifth generation new radio (5G NR) RAT, communication devices typically have increased a number of transmit paths that operate simultaneously. A typical LTE communication device has a maximum of two transmitters that are simultaneously active, one LTE transmitter and one Wi-Fi transmitter. A 5G NR communication device can have up to two 5G NR transmitters in multiple input multiple output (MIMO) operation, one LTE transmitter, and two Wi-Fi transmitters in MIMO operation. To support simultaneous transmissions, the SMPS has traditionally been duplicated, such that the single device has multiple SMPSs. Although SMPSs are relatively simple, each SMPS does add cost and size due to large inductors that are required.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
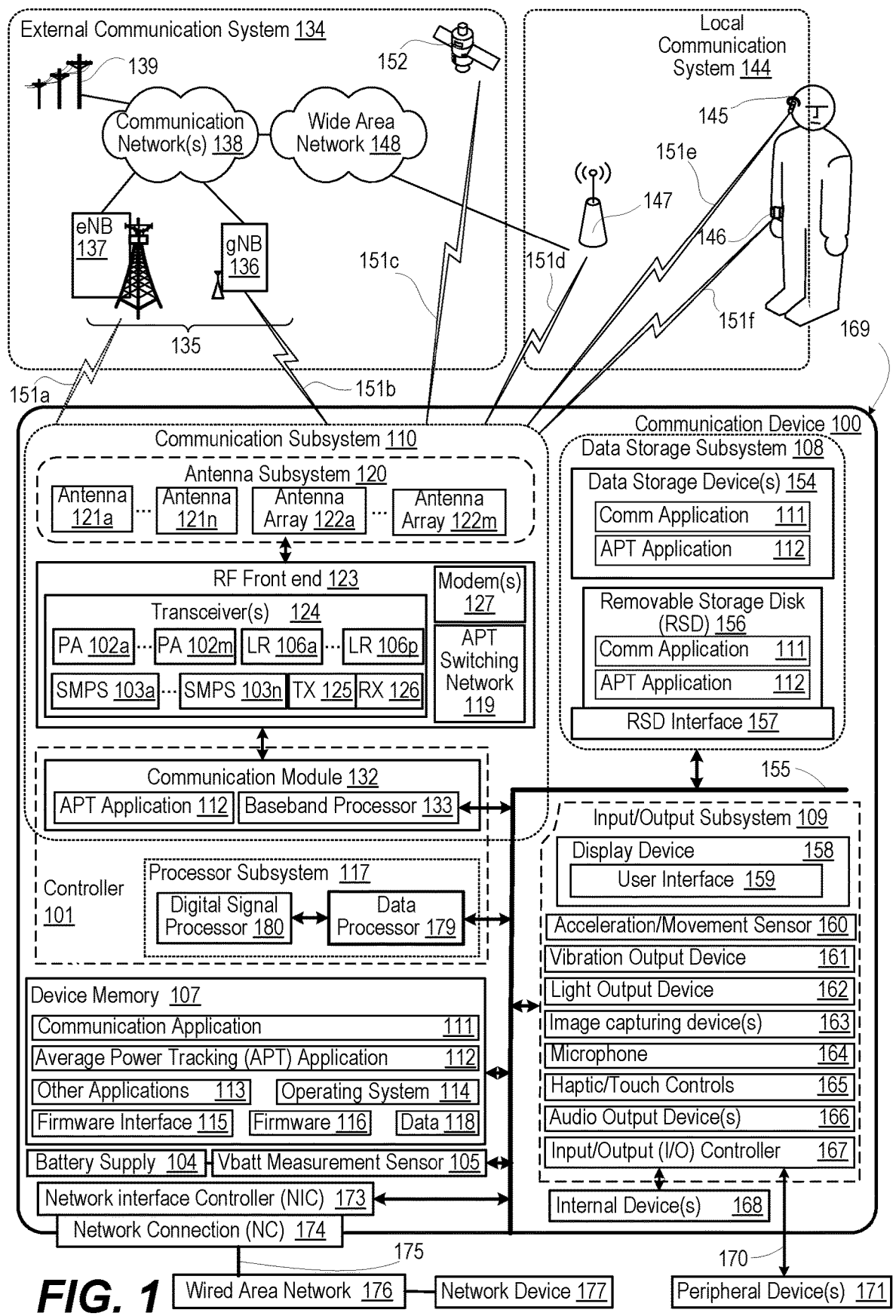
FIG. 1 depicts a functional block diagram of a communication environment including a communication device having a communication subsystem that supports multiple transmission uplinks efficiently amplified by a corresponding number of power amplifiers, according to one or more embodiments.

According to a first aspect of the present disclosure, a communication device, a method and a computer program product support simultaneous transmissions amplified by a of power amplifiers (PAs) powered by a fewer number of switched mode power supplies (SMPSs). The communication device assigns and configures a combination of the SMPSs and linear regulators to support all of the PAs that are active to amplify the simultaneous transmissions. In particular, a controller of the communication device efficiently manages power for the PAs using an average power tracking (APT) technique. Generally, the APT technique matches a supply voltage to a short-term average radio frequency (RF) output power of the PA. A communication device that has a varying battery voltage can be matched to the RF output power by using a switched-mode power supply (SMPS) that tracks the average RF power. The SMPS output voltage is programmed based on the near-term average maximum power. An SMPS efficiency will vary from about 80 to over 95% depending on the input and output voltage and the required current. The use of one or more linear regulators, which are less power efficient, in place of a separate SMPS for each PA avoids the increase in cost and form factor required to provide each SMPS. The communication device includes a battery voltage sensor that detects an output voltage level of a battery supply. A communication subsystem of the communication device has a first number ("N1") of two or more PAs assignable to respective transmit uplinks. The communication subsystem has a second number ("N2") of one or more SMPSs powered by the battery supply. The number N2 of SMPSs is less than the number N1 of PAs. The communication subsystem includes a third number ("N3") of one or more linear regulators. A sum of N2 and N3 is equal to or greater than N1 to enable powering all of the two or more PAs. The one or more linear regulators are powered by one of (i) output voltage of the battery supply and (ii) one of the one or more SMPSs. The communication subsystem includes a power switching network that enables selectively connecting the SMPSs and linear regulators to the PAs. A controller is communicatively coupled to the battery voltage sensor, the communication subsystem, and the one or more SMPSs. The controller determines an average power tracking supply voltage value for each of the two or more PAs. The controller assigns the one or more SMPSs and the one or more linear regulators to the one or more PAs to achieve a highest overall or combined system power efficiency.

In one or more embodiments, the communication device includes a power switching network configurable to couple to one of the battery supply, one of the one or more SMPSs, and one or more linear regulators to power each of the PAs. The switching network is further configurable to couple one of the output voltage of the battery supply and one of the SMPSs to power each of the one or more linear regulators. The controller assigns and configures the one or more SMPSs to power one or more of the two or more PAs. The controller assigns one or more linear regulators that are less power efficient than the one or more SMPSs to power a corresponding number of the two or more PAs not assigned to the one or more SMPSs. The controller configures the power switching network to connect the assigned one or more SMPSs and one or more linear regulators to respective ones of the two or more PAs.

The present innovation enables scaled power supply management to support additional PAs for increased number of transmit uplinks in new and anticipated wireless protocols and radio access technologies (RATs). In an example of increased number of transmit uplinks, transmissions in the same frequency band may be used for intra-band uplink carrier aggregation (CA) or uplink multiple input multiple output (MIMO). In another example, concurrent transmission may occur for different frequency bands, such as interband UL CA. Initial deployment of fifth generation (5G) new radio (NR) cellular base nodes often included integration with co-located fourth generation (4G) long term evolved (LTE) base nodes for non-standalone (NSA) dual connectivity at an LTE-NR radio access node (RAN). NSA is also referred to as LTE-NR dual connection (EN-DC), which is also an example of interband multiple transmission. In the future, the number of concurrent uplinks may increase to three active PAs, such as to support three (3) band interband UL CA or two (2) UL CA with UL MIMO. In the radio frontend, two separate PAs would normally be used, with each PA tuned to support each band for interband cases. For intraband cases, two (2) PAs are used to reduce the impact of non-linearity and to support spatial diversity.

The present disclosure recognizes that, in many situations, the radio is only in single transmission at any given instant. In the cases where simultaneous transmissions are configured in the general sense, there are times that the transmissions are actually non-overlapping for at least some of the time. Such a case might happen in the case of a frequency division duplex (FDD) band with a time division duplex (TDD) band. A TDD band is time multiplexed, and the UL and downlink (DL) share the same channel. In FDD systems, the UL and DL are full duplex and have their own dedicated channels. In two FDD bands, one or both of the UL may not be transmitting due to lack of data or scheduling. As the capability for simultaneous transmission increases, the present disclosure provides a power supply solution that is generally as efficient as the conventional approach of adding additional PAs and SMPSs to match the number of simultaneous transmissions. With increasing number of transmit bands, the present disclosure anticipates that one of the PAs and SMPS are likely to be idle at any given instant. The overlap/concurrency of transmissions that require activation of all of the PAs and SMPSs will be statistically limited. Resorting to using a lower efficiency approach with a linear regulator in this situation will not bring down the overall transmitter efficiency in any substantial way. By using the less efficient power solution, the present disclosure avoids incorporating a larger and more expensive solution that requires the device to be configured to always have enough power-efficient SMPSs available. By selectively using one or more linear regulators in conjunction with a reduced number of more power efficient SMPS, the disclosure supports those rare cases where the full complement of multiple transmit capabilities are being used. According to one or more embodiments, the linear regulators are low-dropout regulators (LDOs). LDOs are distinguished by their ability to maintain regulation with small differences between supply voltage and load voltage. For example, as a lithium-ion battery drops from 4.2 V (fully charged) to 2.7 V (almost discharged), an LDO can maintain a constant 2.5 V at the load.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention. The description of the illustrative embodiments can be read in conjunction with the accompanying figures. Embodiments incorporating teachings of the present disclosure are shown and described with respect to the figures presented herein.

FIG. 1 is a functional block diagram of an electronic device in an operating environment within which the features of the present disclosure are advantageously implemented. In particular, communication device 100, managed by controller 101, is an example of an electronic device that supports multiple transmission uplinks amplified by a corresponding number of PAs 102a-102m that are powered by a fewer number of SMPSs 103a-103n. The fewer number of SMPSs 103a-103n are managed according to the APT technique. SMPSs 103a-103n provide a required voltage level from battery supply 104, which has a battery output voltage, sensed by battery voltage (Vbatt) measurement sensor 105, that varies in relation to an amount of stored charge. Communication device 100 includes one or more programmable linear regulator power supplies ("linear regulators") 106a-106p that are used in cases where the fewer number of SMPs 103a-103n are insufficient for the number of PAs 102a-102m that are scheduled to support concurrent transmit uplinks.

PA 102a to PA 102m are collectively a first number ("N1") of two or more PAs. SMPS 103a to SMPS 103n collectively provide a second number ("N2") of one or more SMPSs powered by battery supply 104. The number N2 is less than N1, meaning that the number of SMPSs 103a-103n is less than the number of PAs 102a-102m. LR 106a to LR 106p are collectively a third number ("N3") of one or more linear regulators 106a-106p. A sum of N2 and N3 is equal to or greater than N1 to enable the combination of SMPs 103a-103n and linear regulators 106a-106p to power all of the two or more PAs 102a-102m.

Communication device 100 can be one of a host of different types of devices, including but not limited to, a mobile cellular phone, satellite phone, or smart-phone, a laptop, a net-book, an ultra-book, a networked smartwatch or networked sports/exercise watch, and/or a tablet computing device or similar device that can include wireless communication functionality. As a device supporting wireless communication, communication device 100 can be utilized as, and also be referred to as, a system, device, subscriber unit, subscriber station, mobile station (MS), mobile, mobile device, remote station, remote terminal, user terminal, terminal, user agent, user device, a Session Initiation Protocol (SIP) phone, a wireless local loop (WLL) station, a personal digital assistant (PDA), computer workstation, a handheld device having wireless connection capability, a computing device, or other processing devices connected to a wireless modem.

Referring now to the specific component makeup and the associated functionality of the presented components. In one or more embodiments, communication device 100 includes controller 101 and device memory 107, data storage subsystem 108, input/output (I/O) subsystem 109, and communication subsystem 110, that are each managed by controller 101. Device memory 107 includes program code for applications, such as communication application 111, average power tracking (APT) application 112, and other application (s) 113. Device memory 107 further includes operating system (OS) 114, firmware interface 115, such as basic input/output system (BIOS) or Uniform Extensible Firmware Interface (UEFI), and firmware 116.

Controller 101 includes processor subsystem 117, which executes program code to provide operating functionality of communication device 100 to reduce setup time to connect a communication service by initiating fallback to a different cellular. The software and/or firmware modules have varying functionality when their corresponding program code is executed by processor subsystem 117 or secondary processing devices within communication device 100. Processor subsystem 117 of controller 101 can execute program code of communication application 111, APT application 112, and other application(s) 113 to configure communication device 100 to perform specific functions. Device memory 107 can include data 118 used by the applications. APT application 112 monitors communication application 111 to determine what transmit uplinks are scheduled. Controller 101, executing APT application 112, monitors Vbatt measurement sensor 105 to determine how to configure SMPSs 103a-103n and linear regulators 106a-106p, based on a state of charge of battery supply 104. Controller 101 configures APT switching network 119 of communication subsystem 110 to connect assigned SMPSs 103a-103n and linear regulators 106a-106p to power PAs 102a-102m at the assigned times. In particular, controller 101 determines an APT supply voltage value for each of two or more PAs 102a-102m. Controller 101 assigns the one or more SMPSs 103a-103n and the one or more linear regulators 106a-106p PAs 102a-102m to achieve a highest overall or combined system power efficiency.

Communication subsystem 110 includes antenna subsystem 120, which includes first antennas 121a-121n and second antennas 122a-122m that support various RF bands for wireless and cellular services. With wireless frequency spectrum seemingly ever expanding, additional antennas (121a-121n, 122a-122m) are incorporated to support newer RATs and multi band operation. Dual low band (2L) or quad low band (4L) multiple input multiple output (MIMO) operation dictates multiple antennas communicate on multiple bands simultaneously. In one or more embodiments, first antennas 121a-121n support lower frequency bands such as ultra-high band (UHB). Second antennas 122a-122m are array modules (ARMs) that support MIMO communication in higher frequency bands, such as millimeter Wave (mmWave).

Communication subsystem 110 includes RF frontend 123 having transceiver(s) 124 that includes transmitter(s) 125 ("TX") and receiver(s) 126 ("RX"). RF frontend 123 further includes modem(s) 127. Communication subsystem 110 also includes communication module 132 having baseband processor 133. Baseband processor 133 communicates with controller 101 and RF frontend 123. In one or more embodiments, baseband processor 133 performs a primary or support function as part of controller 101. Communication subsystem 110 communicates with external communication system 134. Baseband processor 133 operates in baseband frequency range to encode data for transmission and decode received data, according to a communication protocol. Modem(s) 127 modulate baseband encoded data from communication module 132 onto a carrier signal to provide a transmit signal that is amplified by transmitter(s) 125. Modem(s) 127 demodulates received signal(s) from external communication system 134 detected by antenna subsystem 120. The received signal is amplified and filtered by receiver (s) 126, which demodulate received encoded data from a received carrier signal. In an example, communication subsystem communicates with cellular network nodes 135, such NR base node (gNB) 136 or LTE base node (eNB) 137 that are part of one or more radio access network (RANs) to connect to communication network(s) 138. Communication network(s) 138 may be communicatively connected to plain old telephone system (POTS) 139.

In other applications, local communication system 144 can include localized or personal devices such as wireless headset 145 and smart watch 146. Local communication systems 144 can further include access nodes 147 for wireless communication. Communication devices 100 can be provided communication services by wide area network (s) 148 that are part of external communication system 134 and linked to access nodes 147. Wide area network(s) 148 may also provide data services to communication network(s) 138 that provide communication service to communication device 100 via cellular base nodes 135.

Communication subsystem 110 communicates with eNB 137 via uplink/downlink channels 151a. Communication subsystem 110 communicates with gNB 136 via uplink/downlink channels 151b. Communication subsystem 110 receives satellite broadcast signals 151c from GPS satellites 152. Communication subsystem 110 communicates with access node 147 via transmit/receive signals 151d. Communication subsystem 110 communicates with wireless headset 145 via transmit/receive signals 151e. Communication subsystem 110 communicates with smart watch 146 via transmit/receive signals 151f.

In one or more embodiments, controller 101, via communication subsystem 110, performs multiple types of cellular OTA or wireless communication with external communication system 134. Communication subsystem 110 can communicate via Bluetooth connection with one or more personal access network (PAN) devices, such as wireless headset 145 and smart watch 146. Communication via Bluetooth connection includes both transmission and reception via a Bluetooth transceiver device. In one or more embodiments, communication subsystem 110 communicates with one or more locally networked devices via a wireless local area network (WLAN) link provided by access node 147. In one or more embodiments, access node 147 supports communication using one or more IEEE 802.11 WLAN protocols. Access node 147 is connected to wide area network(s) 148, such as the Internet. In one or more embodiments, communication subsystem 110 communicates with GPS satellites 152 to obtain geospatial location information.

Data storage subsystem 108 of communication device 100 includes data storage device(s) 154. Controller 101 is communicatively connected, via system interlink 155, to data storage device(s) 154. Data storage subsystem 108 provides applications, program code, and stored data on nonvolatile storage that is accessible by controller 101. For example, data storage subsystem 108 can provide a selection of applications and computer data such as communication application 111 and APT application 112. These applications can be loaded into device memory 107 for execution by controller 101. In one or more embodiments, data storage device(s) 154 can include hard disk drives (HDDs), optical disk drives, and/or solid-state drives (SSDs), etc. Data storage subsystem 108 of communication device 100 can include removable storage device(s) (RSD(s)) 156, which is received in RSD interface 157. Controller 101 is communicatively connected to RSD 156, via system interlink 155 and RSD interface 157. In one or more embodiments, RSD 156 is a non-transitory computer program product or computer readable storage device. Controller 101 can access RSD 156 or data storage device(s) 154 to provision communication device 100 with program code, such as code for communication application 111 and APT application 112.

I/O subsystem 109 includes user interface components such as display device 158 that presents user interface 159. I/O subsystem 109 may include acceleration/movement sensor 160, vibration output device 161, light output device 162, image capturing device(s) 163, microphone 164, touch/haptic controls 165, and audio output device(s) 166. I/O subsystem 109 also includes I/O controller 167. I/O controller 167 provides communication and power signals to functional components described herein as part of device memory 107, communication subsystem 110, data storage subsystem 108, or I/O subsystem 109. I/O controller 167 connects to internal devices 168, which are internal to housing 169, and via electrical cable 170 to tethered peripheral devices 171, which are external to housing 169 of communication device 100. Internal devices 168 include computing, storage, communication, or sensing components depicted within housing 169. I/O controller 167 supports the necessary configuration of connectors, electrical power, communication protocols, and data buffering to act as an interface between internal devices 168 and peripheral devices 171 tethered by electrical cable 170 and other components of communication device 100 that use a different configuration for inputs and outputs.

In one or more embodiments, I/O subsystem 109 includes network interface controller (NIC or "network interface") 173 with a network connection (NC) 174. Network cable 175 connects NC 174 to wired area network 176. NIC 173 can be referred to as a "network interface" that can support one or more network communication protocols. Wired area network 176 can be a local area network (LAN), a campus area network (CAN), a metropolitan area network (MAN), or a wide area network (WAN). For example, NC 174 can be an Ethernet connection. Network device 177 is communicatively coupled to wired area network 176.

Controller 101 manages, and in some instances directly controls, the various functions and/or operations of communication device 100. These functions and/or operations include, but are not limited to including, application data processing, communication with second communication devices, navigation tasks, image processing, and signal processing. In one or more alternate embodiments, communication device 100 may use hardware component equivalents for application data processing and signal processing. For example, communication device 100 may use special purpose hardware, dedicated processors, general purpose computers, microprocessor-based computers, micro-controllers, optical computers, analog computers, dedicated processors and/or dedicated hard-wired logic.

Controller 101 includes processor subsystem 117, which includes one or more central processing units (CPUs), depicted as data processor 179. Processor subsystem 117 can include one or more digital signal processors 180 that are integrated with data processor 179. Processor subsystem 117 can include other processors that are communicatively coupled to data processor 179, such as baseband processor 133 of communication module 132. In one or embodiments that are not depicted, controller 101 can further include distributed processing and control components that are external to housing 169 or grouped with other components, such as I/O subsystem 109. Data processor 179 is communicatively coupled, via system interlink 155, to device memory 107. In one or more embodiments, controller 101 of communication device 100 is communicatively coupled via system interlink 155 to communication subsystem 110, data storage subsystem 108, and I/O subsystem 109.

System interlink 155 represents internal components that facilitate internal communication by way of one or more shared or dedicated internal communication links, such as internal serial or parallel buses. As utilized herein, the term "communicatively coupled" means that information signals are transmissible through various interconnections, including wired and/or wireless links, between the components. The interconnections between the components can be direct interconnections that include conductive transmission media or may be indirect interconnections that include one or more intermediate electrical components. Although certain direct interconnections (system interlink 155 are illustrated in FIG. 1, it is to be understood that more, fewer, or different interconnections may be present in other embodiments.

Figure 2:
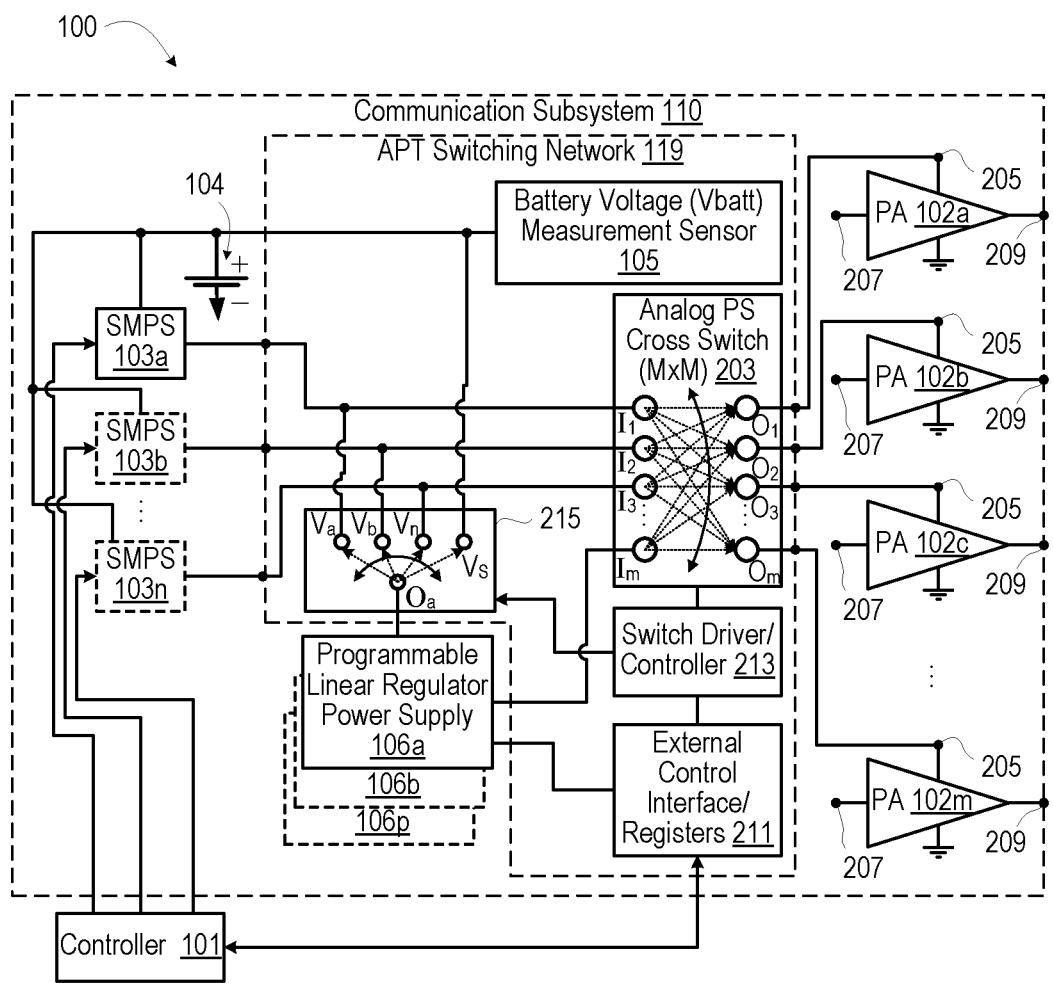
FIG. 2 depicts a simplified functional block diagram of portions of the communication device including a controller that is communicatively coupled to transmit power amplification components of a communication subsystem to efficiently manage power supplied to the power amplifiers with a lesser number of switched mode power supplies, according to one or more embodiments.

FIG. 2 depicts a simplified functional block diagram of portions of communication device 100 including controller 101 that is communicatively coupled to transmit power amplification components of communication subsystem 110. Each of SMPSs 103a, 103b, . . . , 103n is powered by battery supply 104 and configured by controller 101 to provide a voltage output based on the APT technique. Communication device 100 may include one, two, three, or more SMPSs 103a-103n that provide respective voltage output to input nodes $I_1$-$I_n$ of analog power supply cross switch 203. Analog power supply cross switch 203 is part of APT switching network 119 and has at least M number of inputs and at least M number of outputs $O_1$-$O_m$ that correspond to at least the maximum number of active PAs 102a, 102b, 102c, . . . , 102m. The number of outputs may exceed the maximum number of active PA to provide additional flexibility to support alternate PAs, if desired. Outputs $O_1$-$O_m$ connect to respective voltage supply nodes 205 of PAs 102a-102m to amplify an input signal at respective input node 207. The amplified input signal is then provided at respective output node 209 for transmission. Controller 101 reads and writes to external control interface/registers 211 of APT switching network 119 to configure analog power supply cross switch 203 by controlling switch driver/controller 213. Controller 101 also reads and writes to external control interface/registers 211 to control one or more linear regulators 106a, 106b, . . . , 106p to provide a desired voltage level that is respectively connected to remaining inputs $I_1$-$I_n$ of analog power supply cross switch 203 that are not connected to SMPSs 103a-103n. Controller 101 further reads and writes to external control interface/registers 211 to configure switch driver/controller 213 to configure each switch 215 that corresponds to one or more linear regulators 106a-106p. Inputs $V_a$-$V_n$ of each switch 215 connect to the output voltages supplied by respective SMPSs 103a-103n. Each switch 215 also includes input Vs that receives battery output voltage. The connected source of power is provided by switch 215 to corresponding one or more linear regulators 106a-106p. In one or more embodiments, communication device 100 includes one, two, three, or more linear regulators 106a-106p. A sum of the number of SMPSs 103a-103n and linear regulators 106a-106p matches the number of PAs 102a-102m.

In one or more embodiments, controller 101 manages supply power to high efficiency SMPSs 103a-103n in conjunction with one or more linear regulators 106a-106p to support two or more PAs 102a-102m simultaneously transmitting at any given instant. Linear regulator(s) 106a-106p can be dynamically supplied with either the battery voltage, or the output of one of the SMPS 103a-103n that is in use supplying one or more of active PAs 102a-102m. The selection of supply power to selected linear regulator 106a-106p depends on the programmed or otherwise configured output voltage of linear regulators 106a-106p and SMPSs 103a-103n and calculations of the total system efficiency. Linear power regulator(s) 106a-106p can use the battery voltage if one of the following particular situations arises: (i) output voltages of active SMPSs 103a-103n are below the required regulator output voltage in some temporary transitions states; (ii) a general temporary transition state dependent on switch timing and settling; (iii) use of the battery supply would be more efficient from the total system efficiency standpoint than one of the active SMPSs 103a-103n; or (iv) the SMPS output voltage is actually a boosted SMPS above the battery output voltage, where using the battery as an input to selected linear regulators 106a-106p would be more efficient than using the boosted SMPS voltage output. Otherwise, linear regulators 106a-106p receive power from one of SMPSs 103a-103n. In most but not all cases, an assigned one of SMPSs 103a-103n would support the higher PA voltage and a respective linear regulator 106a-106p would utilize the voltage output of the assigned one of SMPSs 103a-103n. In some cases where the battery voltage is close to the required PA voltage, total system efficiency may indicate use of battery supply 104 for a respective linear regulator 106a-106p to power one of PAs 102a-102m having a higher voltage requirement and use of one of SMPSs 103a-103n to supply another one PAs 102a-102m that has a lower voltage requirement. Similarly, in the case of a very short duration transmitter (Tx) burst, total system efficiency may indicate use of one of linear regulator 106a-106p while utilizing one of SMPSs 103a-103n for the higher duty cycle Tx.

In an example, with two (2) or more SMPSs 103a-103n for three (3) or more active PAs 102a-102m, supply for selected linear regulator 106a-106p can be any of active SMPSs 103a-103n or battery supply 104 depending on best overall system efficiency. Total system efficiency is increased in most cases by supplying selected linear regulator 106a-106p using any of active SMPSs 103a-103n as compared to using battery voltage to supply selected linear regulator 106a-106p. When selected linear regulator 106a-106p is using any of active SMPSs 103a-103n, selected active SMPSs 103a-103n is also supplying one of active PAs 102a-102m at the desired voltage.

In some existing designs, a conventional SMPS is hardwired to multiple PAs. According to aspects of the present disclosure, each SMPS 103a-103n and linear regulator 106a-106p is independent and not permanently connected to any particular PA 102a-102m. The output of any SMPS 103a-103n or any linear regulator 106a-106p can be switched to any PA 102a-102m for added flexibility in assigning a selected one of PA 102a-102m to a power supply. For MIMO operation, one SMPS 103a-103n or one linear regulator 106a-106p can supply two PAs 102a-102m by closing two load switches at analog power supply cross switch 203, as the expected RF power of each PA 102a-102m should be similar.

For the case of two (2) active PAs 102a-102m, one (1) SMPS 103a-103n and one (1) linear regulator 106a-106p may be used. For the case of three (3) active PAs 102a-102m, communication device 100 may include either a single one of SMPS 103a-103n with two linear regulators 106a-106p to achieve a significant cost decrease and reduction in form factor size. Alternatively, two SMPSs 103a-103n with single linear regulator 106a-106p may be used to provide an intermediate solution with better efficiency than one SMPS but having a higher cost and form factor size. The present disclosure enables scaling to higher numbers of active PAs 102a-102m by adding either additional SMPSs 103a-103n and/or linear regulators 106a-106p to match the number of active PAs 102a-102m, where the number of SMPSs 103a-103n is always less than the number of active PAs 102a-102m.

Having a regulated supply at second PA ($102a$-$102_m$) from either one SMPS 103a-103n or one linear regulator 106a-106p that is consistent with a RF power level of second PA ($102a$-$102_m$) is better than supplying second PA 102a-102m with a variable supply from first PA 102a-102m that is higher than necessary because second PA 102a-102m will dissipate more power. The higher dissipated power causes performance differences and degradation, such as causing varying amplification gain, due to thermal heating of second PA 102a-102m. Heat dissipation is spread across various locations instead of being localized at second PA 102a-102m. In addition, each PA 102a-102m will see the same supply voltage during a single transmit uplink scenario as well as in a multiple transmit uplink scenario, resulting in similar performance in both scenarios.

In particular, the present disclosure first provides an improvement for a multi-active PA system. If the required PA voltage is the same for two or more active PAs 102a-102m, a single one of SMPS 103a-103n can be used with resulting efficiency that is nearly the same as using two or more SMPS 103a-103n, one dedicated to each PA 102a-102m. Second, if PAs 102a-102m are not transmitting concurrently, then single SMPS 103a-103n can be time multiplexed to support different voltage levels to achieve maximum efficiency and minimize the usage of linear regulators 106a-106p. Third, in situations where selected PAs 102a-102m are transmitting simultaneously, PA 102a-102m with the higher voltage is supported with selected SMPS 103a-103n and PA 102a-102m with the lower voltage is supported with selected linear regulator 106a-106p. Selected PA 102a-102m having the programmed SMPS voltage set for a higher voltage is used to the supply for selected linear regulator 106a-106p. In most situations, the degradation of using one (1) SMPS with one linear regulator is between 0 and 15% degradation in efficiency as compared to using two (2) SMPS. Fourth, during transitions where selected PA 102a-102m must transition to support a higher or lower output power and consequently a higher or lower PA voltage is required, the transitions on each PA 102a-102m may not be simultaneous. If the voltage of the higher voltage PA (first PA $102a$-$102_m$) is increasing, selected linear regulator 106a-106p can maintain its connection to selected SMPS 103a-103n. If the voltage is decreasing, but still greater than that required for the lower voltage PA 102a-102m, selected linear regulator 106a-106p can maintain its connection to selected SMPS 103a-103n. If the voltage required becomes the same, then selected linear regulator 106a-106p is bypassed and selected SMPS 103a-103n supplies both PAs 102a-102m. If the PA voltage required for selected PA 102a-102m connected to selected SMPS 103a-103n drops below the second PA required voltage, selected SMPS 103a-103n tracks the higher of the two voltages and selected linear regulator 106a-106p now supplies first PA 102a-102m. This change can be achieved through the load switch at analog power supply cross switch 203 to swap the supply to the PAs 102a-102m.

In one or more embodiments, an external controller can manage the selection of programmed voltages and assignment of SMPSs 103a-103n and linear regulator 106a-106p. that supply each PA 102a-102m. The external control can also manage selection as well of the supply for linear regulators 106a-106p, either one of SMPSs 103a-103n or battery supply 104. Assignment of either one of SMPSs 103a-103n or one of linear regulator 106a-16p to selected PA 102a-102m depends on the battery voltage level and required PA voltages to support the RF level and expected currents (power) required for two or more PA 102a-102m. In an example, controller 101 utilizes efficiency curves of SMPSs 103a-103n. The setting of output voltages and assignment of SMPSs 103a-103n and linear regulator 106a-106p to selected PA 102a-102m is based on overall system efficiency. As an example, that is not intuitive, if battery voltage was 3.4 V and the higher power PA 102a-102m requires 3.3V and a second PA 102a-102m requires 2.7V, it is more efficient from a total system perspective to run selected linear regulator 106a-106p from battery voltage and to assign selected SMPS 103a-103n to the lower voltage and output power PA 102a-102m.

In one or more embodiments controller 101 can utilize system information such as transmit duty cycles, modulation, etc. In an example, it may be the case that a high power/low duty cycle transmission is concurrent with a low power/high duty cycle transmission. Recognizing the effect of the duty cycle on overall efficiency, selected SMPS 103a-103n is assigned to the lower transmit signal level for the low power/high duty cycle transmission assigned to one PA 102a-102m that has a greater impact on total power efficiency. Selected linear regulator 106a-106p is assigned to the high power/low duty cycle transmission assigned to another PA 102a-102m that has a lesser impact on total power efficiency.

In one or more embodiments, certain functions may be under distributed control. In an example, linear regulator 106a-106p may automatically choose the supply used to meet the desired output voltage through sensing and monitoring the potential input supply voltages from either SMPS 103a-103n or battery supply 104. Distributed control may not result in an ideal solution based on total efficiency but may achieve other benefits such as operational speed. Even with the simpler automatic controller, power efficiency increases may be possible by establishing certain rules for supporting a simultaneous transmission scenario. If one of the output voltages required to supply selected SMPS 103a-103n is very close to battery voltage (e.g., within 0.2 V), selected linear regulator 106a-106p is supplied by battery supply 104. The rule may further depend on the expected current and whether one output is somewhat lower such as 0.7 V and or potentially higher current as in the case in the scenario described above. S.

Figure 3:
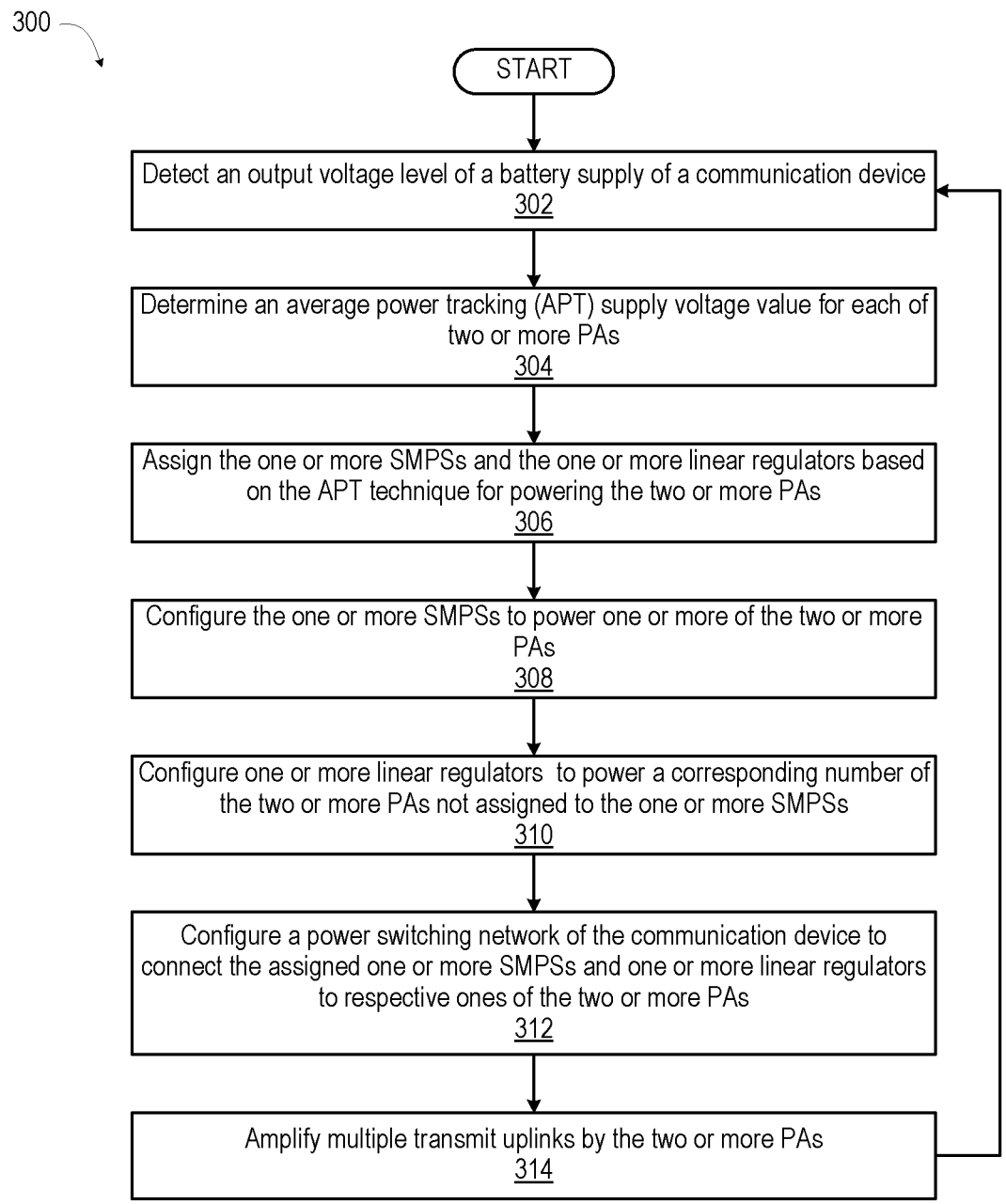
FIG. 3 presents a flow diagram of a method performed by the communication device for efficiently managing power supplied to the power amplifiers utilizing a lesser number of switched mode power supplies, according to one or more embodiments.

FIG. 3 presents a flow diagram of method 300 performed by a communication device for efficiently managing power supplied to a number of power amplifiers, where the communication device has a lesser number of switched mode power supplies. The description of method 300 is provided with general reference to the specific components illustrated within the preceding FIGS. 1-2, and specific components referenced in method 300 may be identical or similar to components of the same name used in describing preceding FIGS. 1-2. In one or more embodiments, controller 101 configures communication device 100 (FIG. 1) to provide functionality of method 300.

Figure 10:
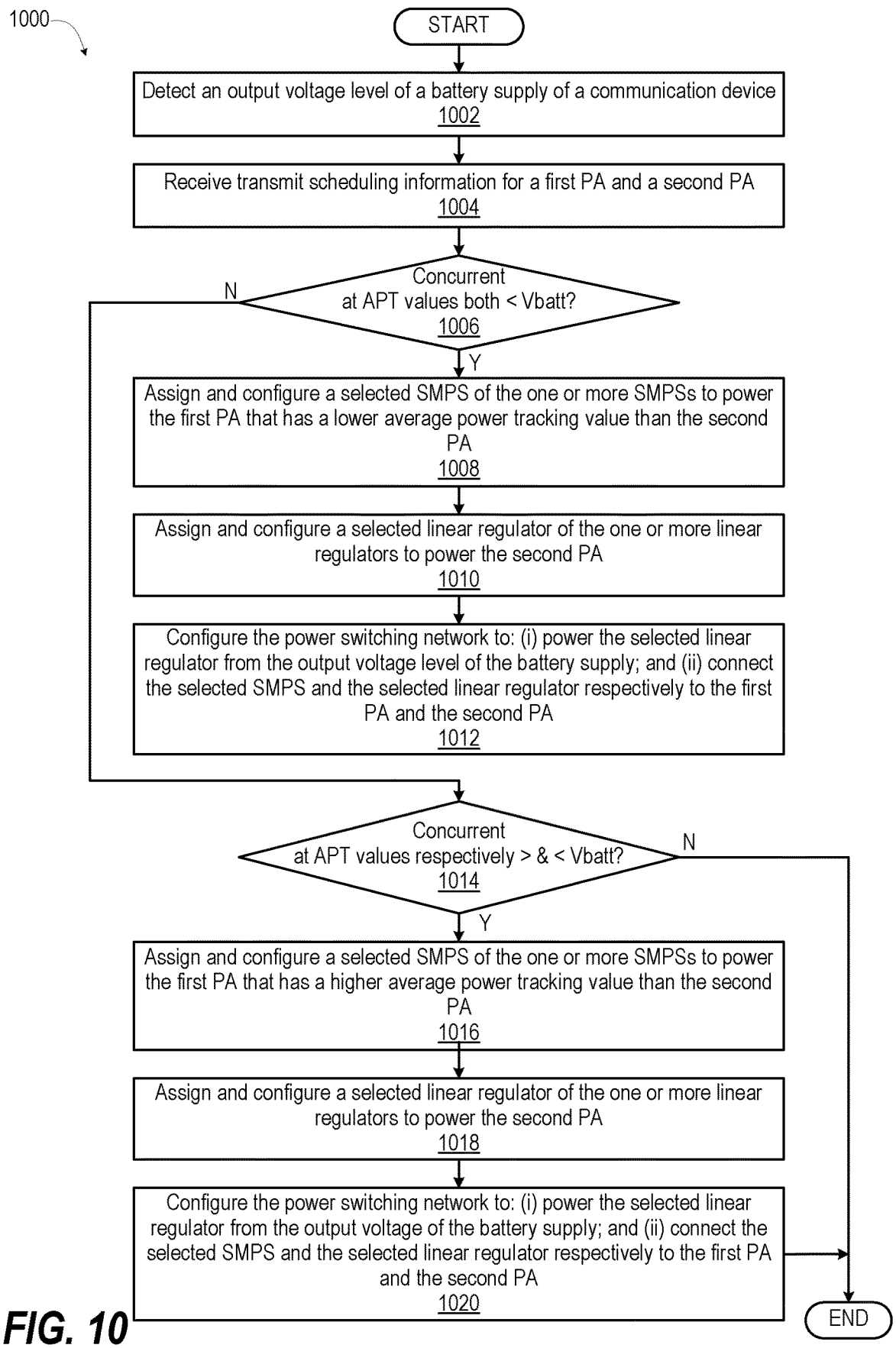
FIG. 10 presents a flow diagram of a method performed by the communication device for efficiently managing power of two or more PAs in special situations related to being below battery voltage or having a duty cycle level that is inverse to required power, according to one or more embodiments.
Figure 11:
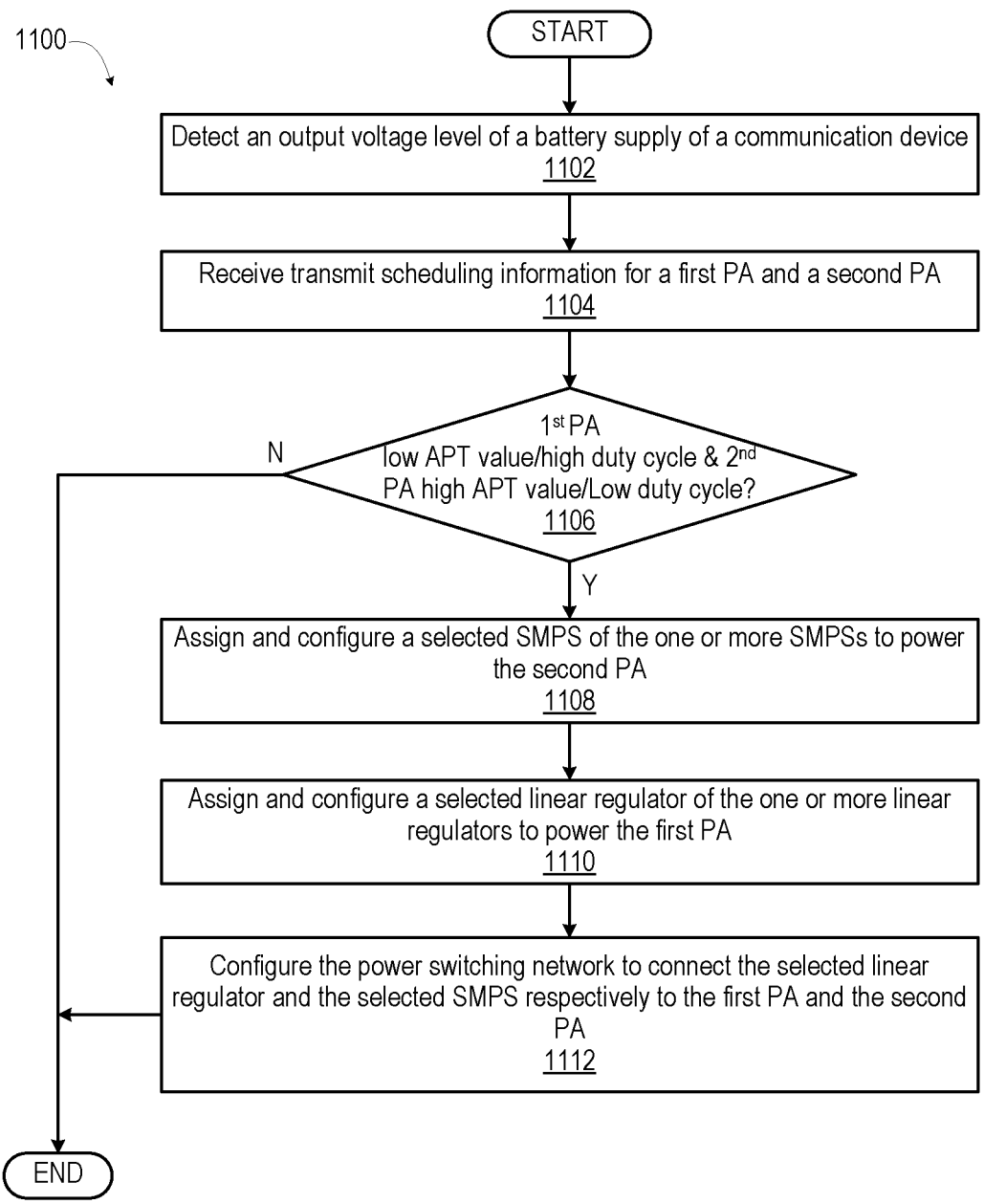
FIG. 11 presents method 1100 that reverses the nominal assignment of an SMPS from a higher average power tracking value to a lower average power tracking value in response to respective duty cycles reversing impacts on total power efficiency, according to one or more embodiments.

With reference to FIG. 3, method 300 includes detecting an output voltage level of a battery supply of a communication device (block 302). The communication device includes a communication subsystem having a first number ("N1") of two or more power amplifiers (PAs) assignable to respective transmit uplinks. The communication subsystem includes a second number ("N2") of one or more switching mode power supplies (SMPSs) powered by the battery supply, where N2 is less than N1. The communication subsystem includes a third number ("N3") of one or more linear regulators that are powered by one of (i) output voltage of the battery supply and (ii) one of the one or more SMPSs. A sum of N2 and N3 is equal to or greater than N1 to enable powering all of the two or more PAs. Method 300 includes determining an average power tracking (APT) supply voltage value for each of two or more PAs (block 304). Method 300 includes assigning the one or more SMPSs and the one or more linear regulators to the one or more PAs to achieve a highest overall or combined system power efficiency (block 306). In an example, a round robin assignment is performed for available SMPSs first, given that the SMPSs are more power efficient than the linear regulators. Then, a round robin assignment is performed for available linear regulators until each PA scheduled to be active has a corresponding assigned source of power. Refinements to these assignments for particular scenarios are described below with regard to methods 600 (FIG. 6), 900 (FIG. 9), 1000 (FIG. 10), and 1100 (FIG. 11). Method 300 includes configuring the one or more assigned SMPSs to power one or more of the two or more PAs at the required output voltage based on APT (block 308). Method 300 includes configuring the one or more assigned linear regulators to produce the required output voltage (block 310). Method 300 includes configuring a power switching network of the communication device to connect the assigned one or more SMPSs and one or more linear regulators to respective ones of the two or more PAs (block 312). Method 300 includes amplifying multiple transmit uplinks respectively using the two or more PAs (block 314). Then method 300 returns to block 302.

Figure 4:
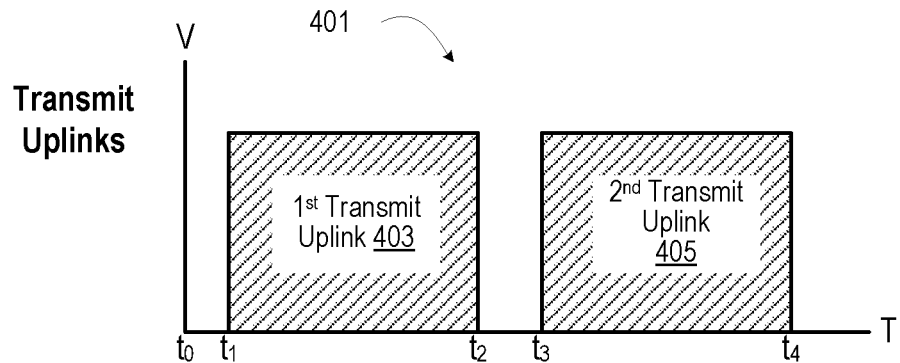
FIG. 4 is a graphical plot of a timing diagram of nonconcurrent transmissions of first and second transmit uplinks, according to one or more embodiments.
Figure 5:
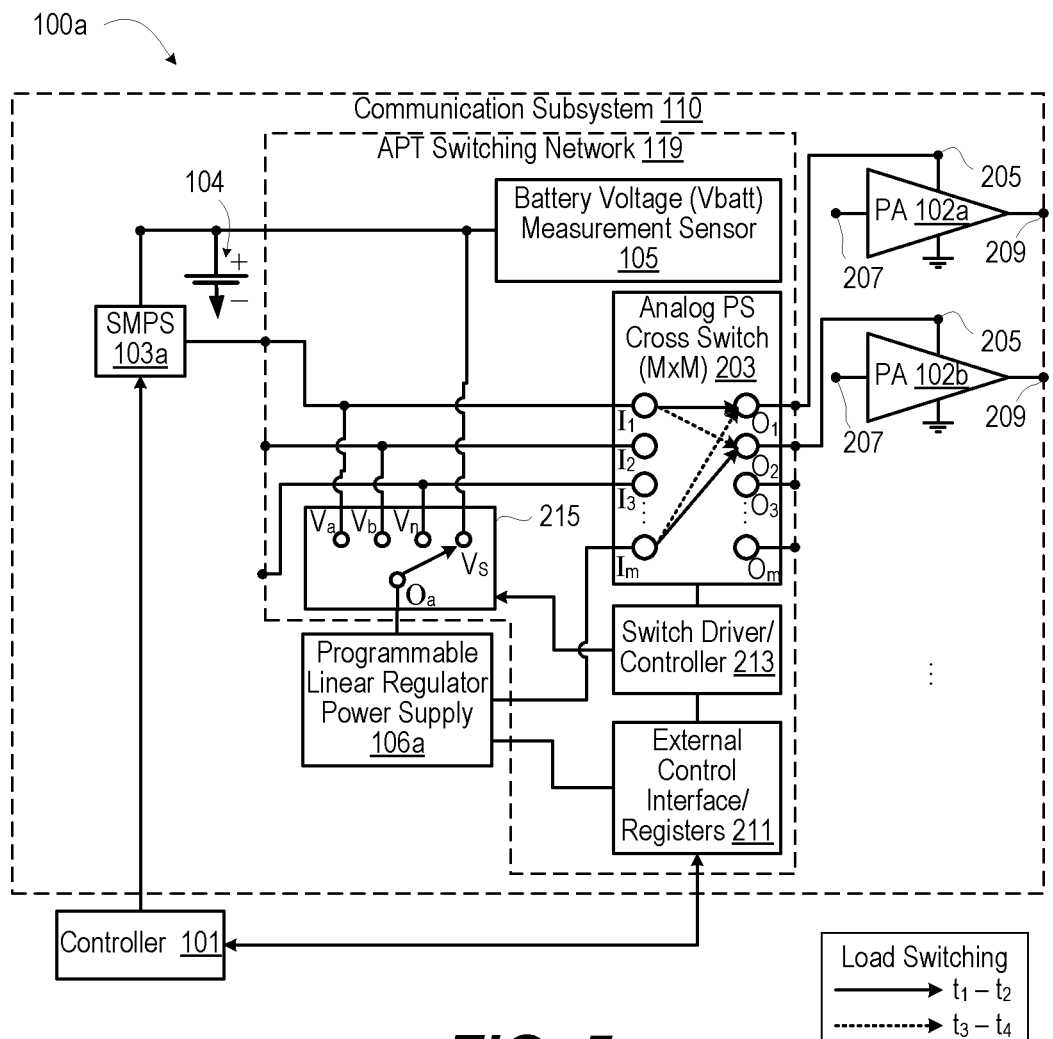
FIG. 5 depicts a simplified functional block diagram of an example communication device that is configured with two PAs that are supported by one switched mode power supply (SMPS) and one linear regulator, according to one or more embodiments.

In addition to addressing the challenges of simultaneous or at least partially concurrent transmissions, the present disclosure includes recognizing opportunities for efficiently powering one PA to support two or more nonconcurrent transmissions. FIG. 4 is a graphical plot of timing diagram 401 of nonconcurrent transmissions of first transmit uplink 403 between times $t_1$ and $t_2$ followed subsequently by second transmit uplink 405 between times $t_3$ and $t_4$. A time gap exists between times $t_2$ and $t_3$ to enable reconfiguring of communication device 100a for second transmit uplink 405 (see FIG. 5). FIG. 5 depicts communication device 100a as described in FIG. 2, except that communication device 100a is specifically configured with two PAs 102a-102b that are supported by one SMPS 103a and one linear regulator 106a. Since only one of PAs 102a-102b is transmitting at a time and there is time between the time gap, controller 101 sets external control interface/registers 211 direct switch driver/controller 213 to first configure analog PS cross switch 203 to connect input $I_1$ to Output $O_1$, supplying output voltage from SMPS 103a to supply PA 102a at least between $t_1$ and $t_2$. In one or more embodiments, PA 102b is idle and analog PS cross switch 203 is also configured to connect input $I_2$ to Output $O_2$, supplying output voltage from linear regulator 106a to supply PA 102b at least between $t_1$ and $t_2$ in order to provide low current bias voltage to PA 102b to maintain its idle state. Switch driver/controller 213 configures switch 215 to supply battery voltage to linear regulator 106a.

Figure 6:
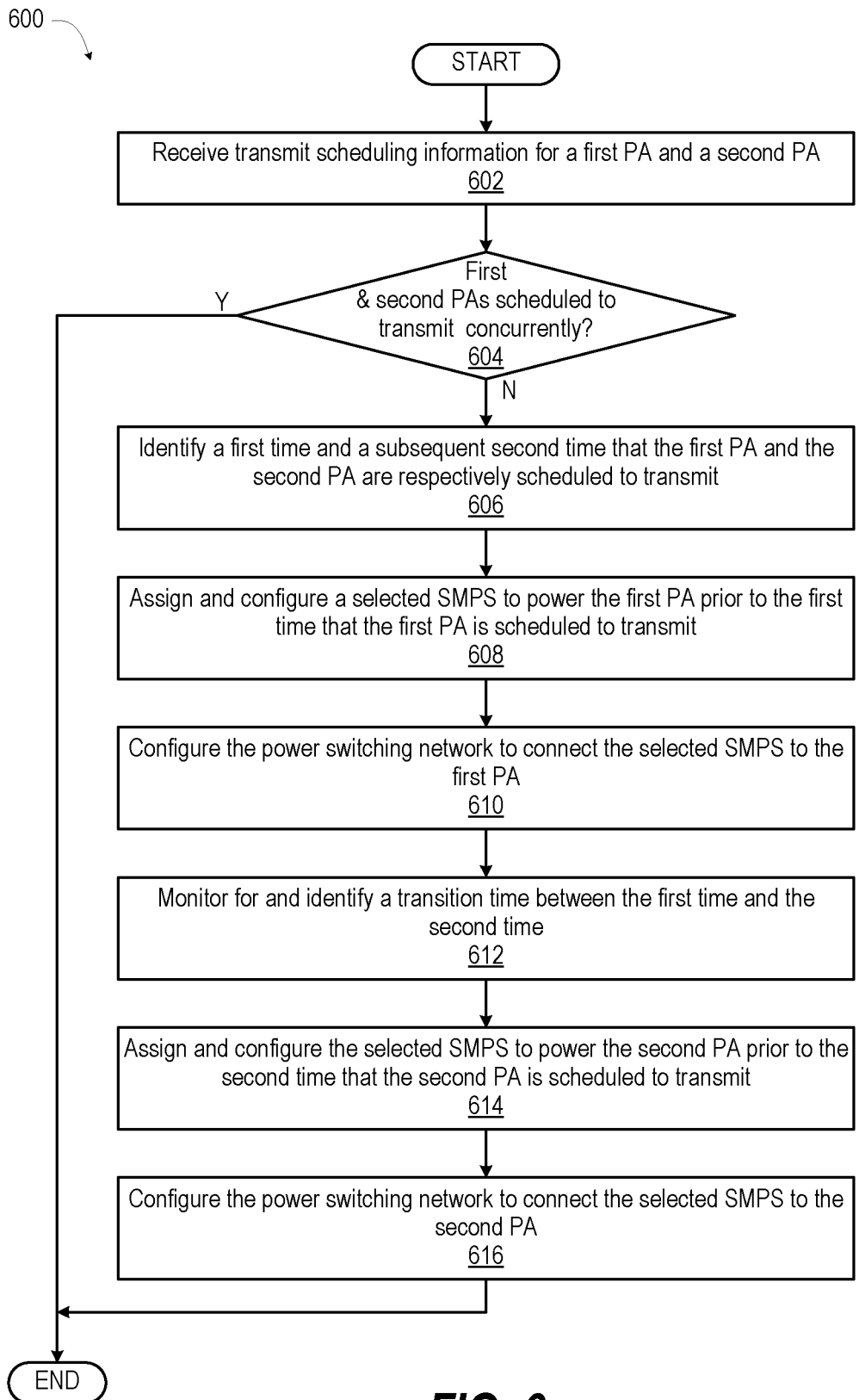
FIG. 6 presents a flow diagram of a method performed by the communication device of FIG. 5 for efficiently managing power supplied to the PAs utilizing a lesser number of SMPSs during concurrent transmissions, according to one or more embodiments.

FIG. 6 presents a flow diagram of method 600 performed by a communication device for efficiently managing power supplied to the power amplifiers utilizing a lesser number of switched mode power supplies during concurrent transmissions. The description of method 600 is provided with general reference to the specific components illustrated within the preceding FIGS. 1-5, and specific components referenced in method 600 may be identical or similar to components of the same name used in describing preceding FIGS. 1-5. In one or more embodiments, controller 101 configures communication device 100 (FIG. 1) or communication device 100a (FIG. 5) to provide functionality of method 600 to augment method 300 (FIG. 3). With reference to FIG. 6, method 600 includes receiving transmit scheduling information for a first PA and a second PA (block 602). Method 600 includes determining whether the first PA and the second PA are scheduled to transmit concurrently (decision block 604). In response to determining that the first and the second PA are scheduled to transmit concurrently, method 600 ends. In response to determining that the first and the second PA are not scheduled to transmit concurrently, i.e., scheduled to transmit non-concurrently, method 600 includes identifying a first time and a subsequent second time that the first PA and the second PA are respectively scheduled to transmit (block 606). Method 600 includes, assigning and configuring a selected SMPS to power the first PA prior to the first time that the first PA is scheduled to transmit (block 608). Method 600 includes configuring the power switching network to connect the selected SMPS to the first PA (block 610). Method 600 includes monitoring for and identifying a transition time between the first time and the second time (block 612). In response to expiration of the first time and/or identifying the transition time, method 600 includes assigning and configuring the selected SMPS to power the second PA prior to the start of the second time that the second PA is scheduled to transmit (block 614). Method 600 includes configuring the power switching network to connect the selected SMPS to the second PA (block 616). Then method 600 ends.

Figure 7:
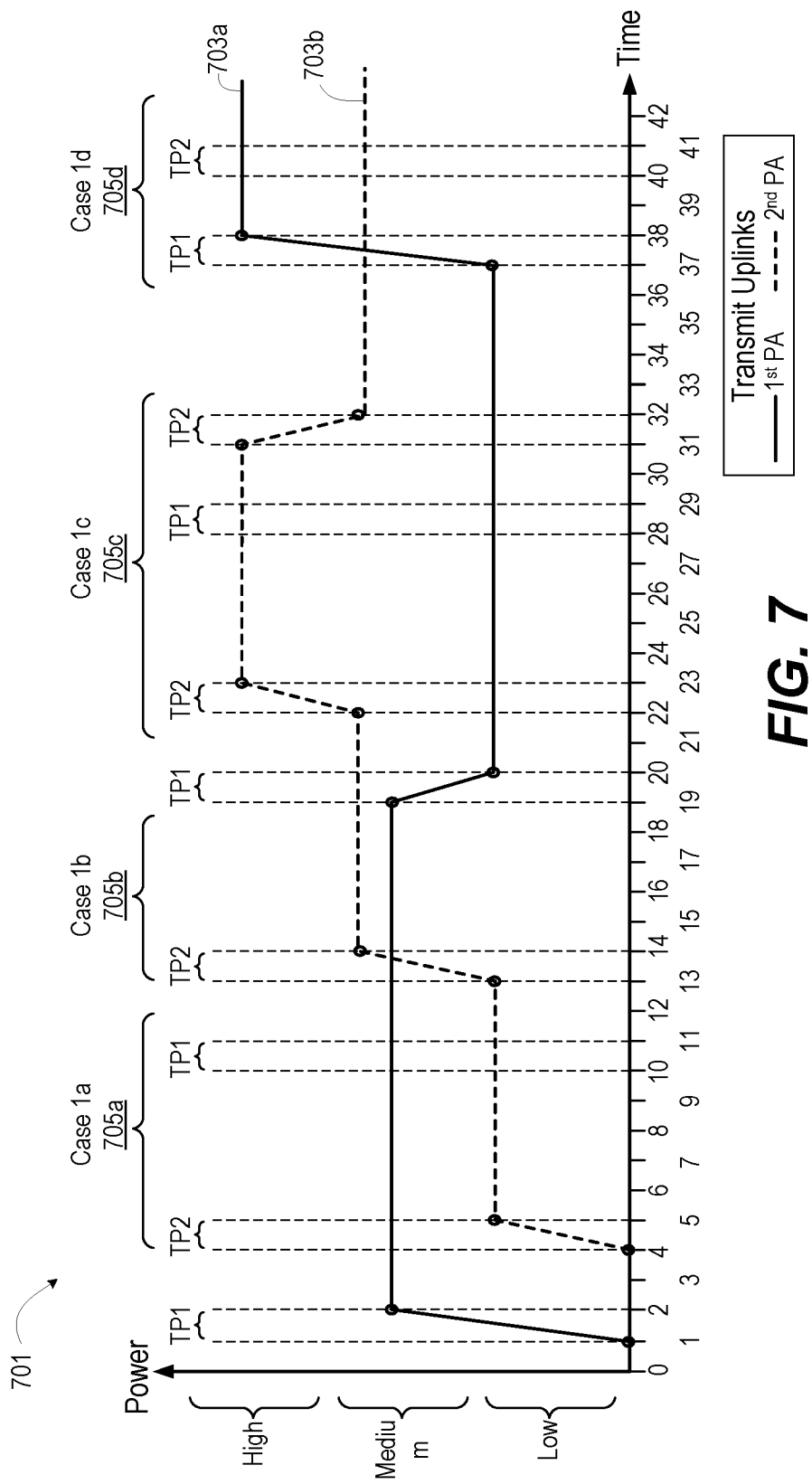
FIG. 7 depicts a timing diagram of first and second transmit uplink power levels that present three cases for power supply switching, according to one or more embodiments.
Figure 8A:
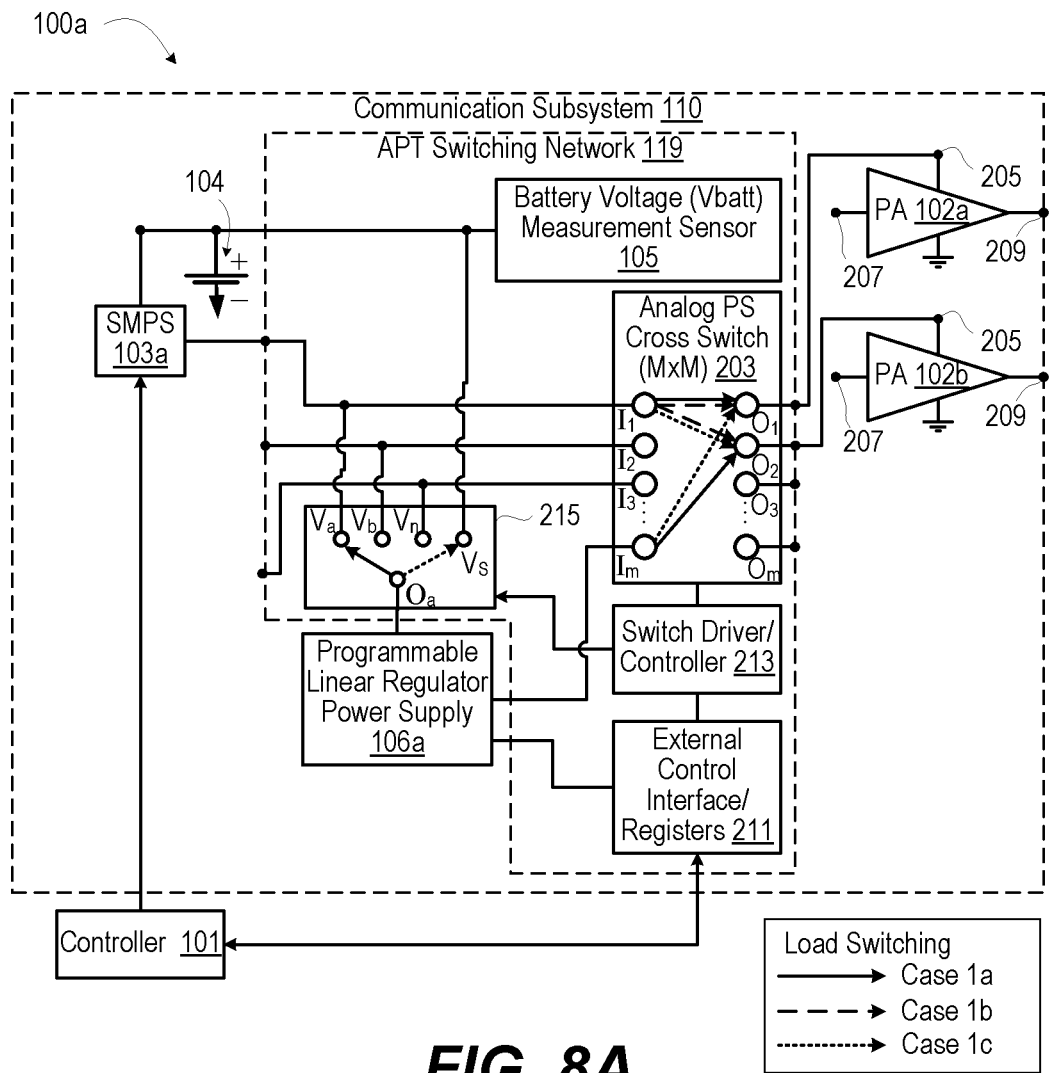
FIG. 8A depicts a simplified functional block diagram of the example communication device of FIG. 5 that is configured to support the first and second transmit uplink power levels of three cases presented in FIG. 7, according to one or more embodiments.
Figure 8B:
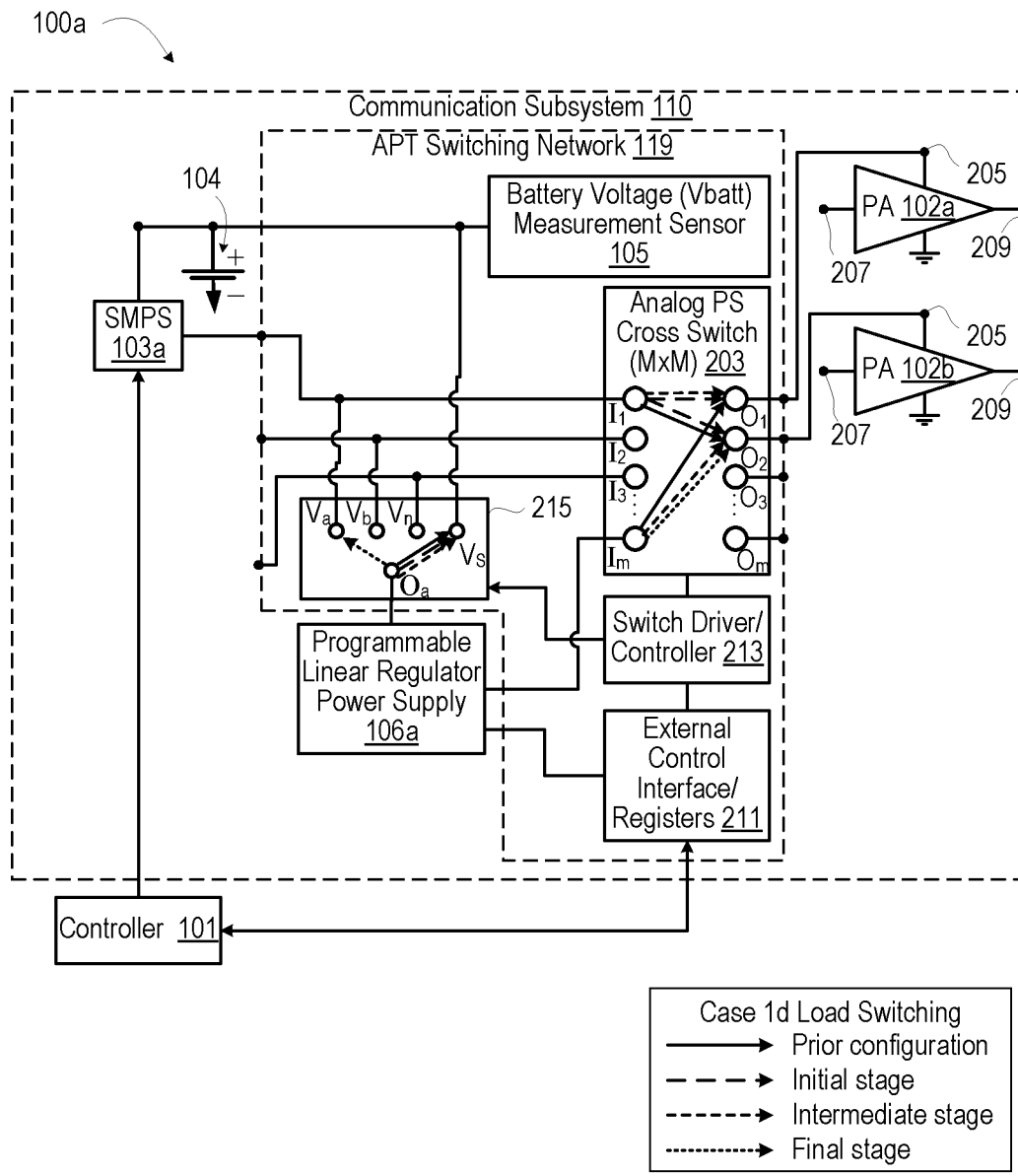
FIG. 8B depicts a simplified functional block diagram of the example communication device of FIG. 8A that is configured to support the first and second transmit uplink power levels of a fourth case presented in FIG. 7, according to one or more embodiments.

FIG. 7 depicts timing diagram 701 of first and second plots 703a-703b of transmit uplink power levels for first PA 102a and second PA 102b (as shown in FIGS. 8A-8B) as a function of time, which is labeled as time "0" (t0) through time "42" ($t_{42}$). First plot 703a depicts power levels for first PA 102a (FIGS. 8A-8B) and second plot 703b depicts power level for second PA 102b (FIGS. 8A-8B). First transient periods (TP1) occur on a periodic basis for first PA 102a, which may be used to adjust the power level. Similarly, second transient period (TP2) occurs on a periodic basis for second PA 102b, which may be used to adjust the respective power level. TP1s and TP2s do not overlap, allowing power adjustments to be made individually for each PA 102a-102b. In particular, TP1s occur between: (i) $t_1$-$t_2$; (ii) $t_{10}$-$t_{11}$; (iii) $t_{19}$-$t_{20}$; and (iv) $t_{28}$-$t_{29}$. TP2s occur between: (i) $t_4$-$t_5$; (ii) $t_{13}$-$t_{14}$; (iii) $t_{22}$-$t_{23}$; (iv) $t_{31}$-$t_{32}$ and (iv) $t_{37}$-$t_{38}$. First plot 703a for first PA 102a (FIGS. 8A-8B) becomes active at time "1" ($t_1$) transitioning to medium power level by time "2" ($t_2$). First plot 703a next transitions at time "19" ($t_{19}$) from medium power level to low power level by time "20" ($t_{20}$). First plot 703a next transitions at time "37" ($t_{37}$) from low power level to high power level by time "38" ($t_{38}$). Second plot 703b for second PA 102b (FIGS. 8A-8B) becomes active at time "4" ($t_4$) transitioning to low power level by time "5" ($t_5$). Second plot 703b next transitions at time "13" ($t_{13}$) from low power level to medium power level by time "14" ($t_{14}$). Second plot 703b next transitions at time "22" ($t_{22}$) from medium power level to high power level by time "23" ($t_{23}$). Second plot 703b next transitions at time "31" ($t_{31}$) from high power level to medium power level by time "32" ($t_{32}$).

The power level transitions present four cases for configuring one SMPS and one linear regulator described below for FIGS. 8A-8B. First case (1a) 705a arises between about times "4" and "12" ($t_4$-$t_{12}$) with first plot 703a at the medium power level for first PA 102a (FIG. 8A) and second plot 703b at the low power level for second PA 102b (FIG. 8A). Second case (1b) 705b arises between about times "13" and "19" ($t_{13}$-$t_{19}$) with first plot 703a ending at the medium power level for first PA 102a (FIG. 8A) and second plot 703b also ending at the medium power level for second PA 102b (FIG. 8A). Third case (1c) 705c arises between about times "19" and at least "32" ($t_{19}$-$t_{32}$) with first plot 703a ending at the high power level for second PA 102b (FIG. 8A) and second plot 703b ending at the low power level for first PA 102a (FIG. 8A). To setup another fourth case (1d) 705d, second plot 703a transitions from between times "31" and "32" ($t_{31}$-$t_{32}$) from high power ending at medium power. Fourth case 705d arises between about times "36" and at least "42" ($t_{19}$-$t_{32}$) with first plot 703a ending at the high power level for second PA 102b (FIG. 8B) and second plot 703b ending at the low power level for first PA 102a (FIG. 8B).

FIG. 8A depicts communication device 100a configured to support the first and second transmit uplink power levels of FIG. 7 during the first three cases. During first case 705a (FIG. 7), switch 215 is configured to provide voltage from SMPS 103a to linear regulator 106a. Analog PS cross switch 203 is configured to connect input $I_1$ to output $O_1$, supplying output voltage from SMPS 103a to supply PA 102a at least between times $t_1$ and $t_2$ (FIG. 7). Analog PS cross switch 203 is further configured to connect input $I_m$ to output $O_2$, supplying output voltage from linear regulator 106a to supply PA 102b at least between $t_1$ and $t_2$ (FIG. 7).

During second case 705b (FIG. 7), analog PS cross switch 203 is configured to connect input $I_1$ that supplies output voltage from SMPS 103a to both output $O_1$ to supply PA 102a during transient period for PA 102b and to output $O_2$ to supply PA 102b at least between times $t_3$ and $t_4$ (FIG. 7). Switch 215 is configured to not supply voltage to linear regulator 106a.

During third case 705c (FIG. 7), switch 215 is configured to provide voltage from SMPS 103a to linear regulator 106a, which is further configured to support the lower voltage level required to support the decremented power for PA 102a. Analog PS cross switch 203 is configured to connect input $I_m$ to output $O_1$ during the transient period for the PA 102a. Analog PS cross switch 203 maintains its previous connection from input $I_1$ to output $O_2$, supplying output voltage from SMPS 103a to supply PA 102b.

FIG. 8B depicts communication device 100a configured to support the first and second transmit uplink power levels of FIG. 7 during the fourth case that includes several switching stages. During fourth case 705d (FIG. 7), PA 102a is required to significantly increase power level at time "37" ($t_{37}$), going above the power level for PA 102b. PA 102b is between transition periods, so SMPS 103a continues to support PA 102b. In an initial stage of case 1d 705d, analog PS cross switch 203 is configured to connect input $I_1$ to outputs $O_1$ of transient period for PA 102a. Analog PS cross switch 203 maintains its previous connection from input $I_1$ to output $O_2$, supplying output voltage from SMPS 103a to supply PA 102b. Switch 215 is configured to provide voltage from battery supply 104 to linear regulator 106a, which is further configured to support the medium voltage level required to support the PA 102b. During intermediate stage of case 1d 705d, analog PS cross switch 203 is configured to connect input $I_m$ to output $O_2$ to support PA 102b. SMPS 103a is programmed to the higher power level to support PA 102a. During transition period for PA 102b between times "40" and "41" ($t_{40}$-$t_{41}$), switch 215 may be configured to connect SMPS 103a to linear regulator 106a instead of battery supply 104 for improved power efficiency.

In some scenarios, switch 215 can be configured to battery supply 104 for a time between two transient periods instead of directly connecting to SMPS 103a to avoid loading one of SMPSs 103a-103b that supplies PA 102a-102b that is active and not in a transient period. That loading may cause a power supply transient and could affect the RF output signal. In such a case, switch 215 can be reconfigured to SMPS 103a-103b during the next transient period to a more efficient configuration. There are other cases where the use of an intermediate state may be required to manage the allocation of SMPSs 103a-103b and linear regulators 106a to maintain the voltage during non-transient periods. SMPS is reconfigured to a higher voltage level during transient period of PA 102a to support the higher power for PA 102a at the end of the transient period.

Figure 9:
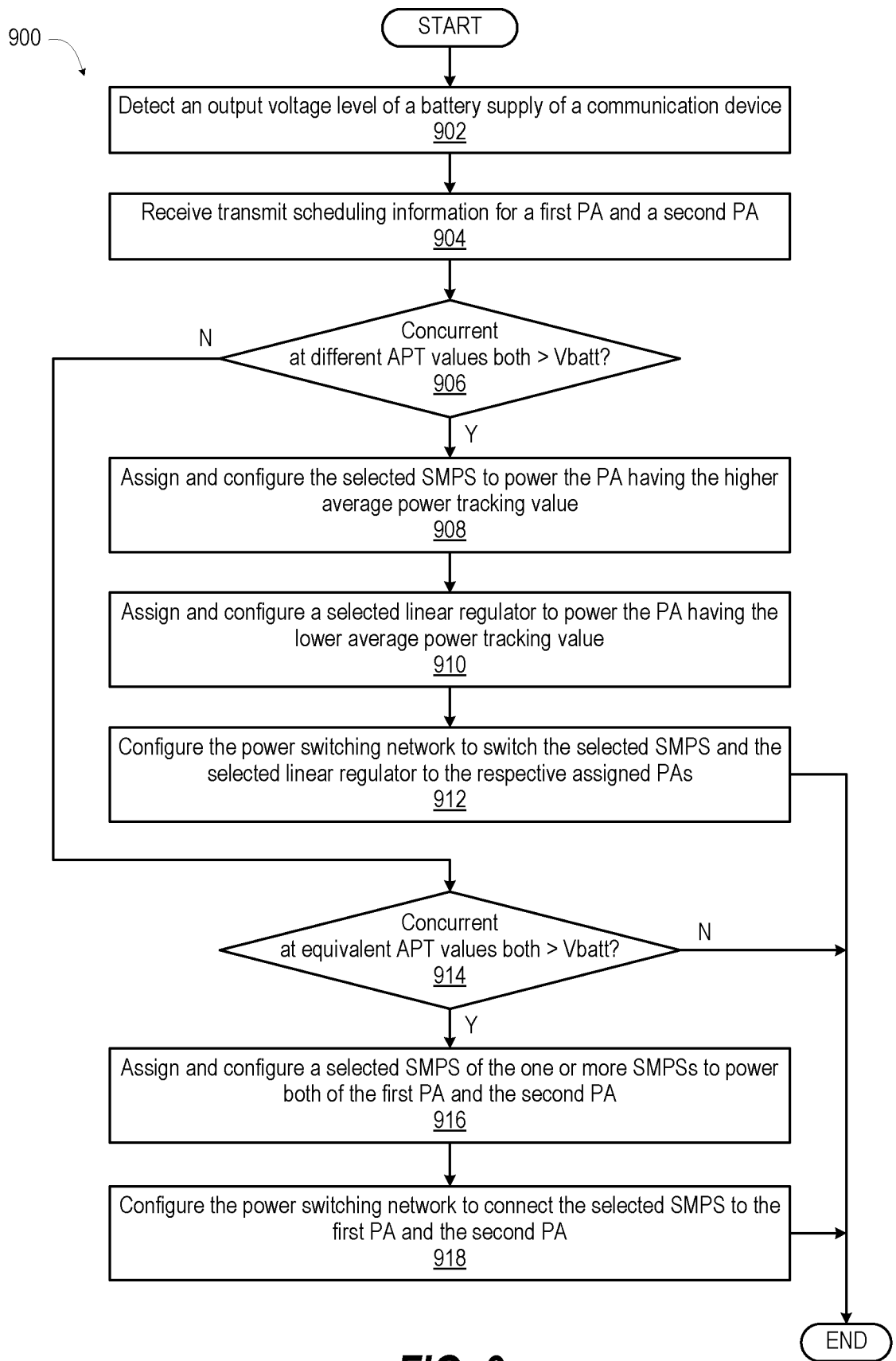
FIG. 9 presents a flow diagram of a method performed by the communication device for efficiently managing power transitions between two PAs using one SMPS and one linear regulator, according to one or more embodiments.

FIG. 9 presents method 900 performed by a communication device for efficiently managing power transitions above battery voltage between two PAs using one SMPS and one linear regulator. FIG. 10 presents method 1000 performed by a communication device for efficiently managing power of two or more PAs when at least one average power tracking value is below output voltage of the battery supply. FIG. 11 presents method 1100 that reverses the nominal assignment of an SMPS from a higher average power tracking value to a lower average power tracking value in response to respective duty cycles reversing impacts on total power efficiency. The description of methods 900 (FIG. 9), 1000 (FIG. 10), and 1100 (FIG. 11) are provided with general reference to the specific components illustrated within the preceding FIGS. 1-8, and specific components referenced in methods 900 (FIG. 9), 1000 (FIG. 10), and 1100 (FIG. 11) may be identical or similar to components of the same name used in describing preceding FIGS. 1-8. In one or more embodiments, controller 101 configures communication device 100 (FIG. 1) or communication device 100a (FIGS. 8A-8B) to provide functionality of methods 900 (FIG. 9), 1000 (FIG. 10), and 1100 (FIG. 11) to augment method 300 (FIG. 3) and method 600 (FIG. 6).

With reference to FIG. 9, method 900 includes detecting an output voltage level of a battery supply of a communication device (block 902). Method 900 includes receiving transmit scheduling information for a first PA and a second PA (block 904). Any of the available PAs can be referred to as the first PA and any of the remaining PAs can be referred to as the second PA. For clarity, method 900 refers to two PAs but aspects of the present disclosure may be extended to additional PAs. Method 900 includes determining whether the first PA and the second PA are scheduled to transmit at least partially concurrently at substantially different average power tracking values that are both greater than the output voltage level of the battery supply (decision block 906). In response to determining that the first and the second PA are scheduled to transmit at least partially concurrently at substantially different average power tracking values that are both greater than the output voltage level of the battery supply, method 900 includes assigning and configuring the selected SMPS to power the PA having the higher average power tracking value (block 908). Method 900 includes assigning and configuring a selected linear regulator to power the PA having the lower average power tracking value (block 910). Method 900 includes configuring the power switching network to switch the selected SMPS and the selected linear regulator to the respective assigned PAs (block 912). Then method 900 ends.

In response to determining, in decision block 906, that the first and the second PA are not scheduled to transmit at least partially concurrently at substantially different average power tracking values that are both greater than the output voltage level of the battery supply, method 900 includes determining whether the first PA and the second PA are scheduled to transmit at least partially concurrently at substantially equivalent average power tracking values that are both greater than the output voltage level of the battery supply (decision block 914). In response to determining that the first and the second PA are not scheduled to transmit at least partially concurrently at substantially equivalent average power tracking values that are both greater than the output voltage level of the battery supply, method 900 ends. In response to determining that the first and the second PA are scheduled to transmit at least partially concurrently at substantially equivalent average power tracking values that are both greater than the output voltage level of the battery supply, method 900 includes assigning and configuring a selected SMPS of the one or more SMPSs to power both of the first PA and the second PA (block 916). Method 900 includes configuring the power switching network to connect the selected SMPS to the first PA and the second PA (block 918). Then method 900 ends.

With reference to FIG. 10, method 1000 include detecting an output voltage level of a battery supply of a communication device (block 1002). Method 1000 includes receiving transmit scheduling information for a first PA and a second PA (block 1004). Method 1000 includes determining whether the first PA and the second PA are scheduled to transmit at least partially concurrently with substantially different average power tracking values that are both lower than the output voltage level of the battery supply (decision block 1006). Any of the available PAs can be referred to as the first PA and any of the remaining PAs can be referred to as the second PA. For clarity, method 1000 refers to two PAs but aspects of the present disclosure may be extended to additional PAs. In response to determining that the first and the second PA are scheduled to transmit at least partially concurrently with substantially different average power tracking values that are both lower than the output voltage level of the battery supply, method 1000 includes assigning and configuring a selected SMPS of the one or more SMPSs to power the first PA that has a lower average power tracking value than the second PA (block 1008). Method 1000 includes assigning and configuring a selected linear regulator of the one or more linear regulators to power the second PA (block 1010). Method 1000 includes configuring the power switching network to: (i) power the selected linear regulator from the output voltage level of the battery supply; and (ii) connect the selected SMPS and the selected linear regulator respectively to the first PA and the second PA (block 1012). Then method 1000 returns to block 1002.

In response to determining that the first and the second PA are not scheduled to transmit at least partially concurrently with substantially different average power tracking values that are both lower than the output voltage level of the battery supply in decision block 1006, method 1000 includes determining whether the first PA and the second PA are scheduled to transmit at least partially concurrently with the first PA at a higher average power tracking values that is greater than the output voltage level of the battery supply and the second PA at a lower average power tracking value that is less than the battery voltage (decision block 1014). Again, any of the PAs can be designated as the first PA and any remaining PAs can be designated as the second PA. In response to determining that the first and the second PA are not scheduled to transmit at least partially concurrently at respective average power tracking values that are above and below the output voltage level of the battery supply, method 1000 ends. In response to determining that the first and the second PA are scheduled to transmit at least partially concurrently at respective average power tracking values that are above and below the output voltage level of the battery supply, method 1000 includes assigning and configuring a selected SMPS of the one or more SMPSs to power the first PA that has a higher average power tracking value than the second PA (block 1016). Method 1000 includes assigning and configuring a selected linear regulator of the one or more linear regulators to power the second PA (block 1018). Method 1000 includes configuring the power switching network to: (i) power the selected linear regulator from the output voltage of the battery supply; and (ii) connect the selected SMPS and the selected linear regulator respectively to the first PA and the second PA (block 1020). Then method 1000 ends.

With reference to FIG. 11, method 1100 include detecting an output voltage level of a battery supply of a communication device (block 1102). Method 1100 includes receiving transmit scheduling information for a first PA and a second PA (block 1104). Method 1100 includes determining whether the first PA and the second PA are scheduled to transmit at least partially concurrently with: (i) the first PA at a first duty cycle that is less than a first duty cycle threshold and at a first power level; and (ii) the second PA at a second duty cycle that is greater than both the first and a second duty cycle threshold at a second power level that is lower than the first power level (decision block 1106). Any of the available PAs can be referred to as the first PA and any of the remaining PAs can be referred to as the second PA. For clarity, method 1100 refers to two PAs but aspects of the present disclosure may be extended to additional PAs. In response to determining that the first and the second PA are not scheduled to transmit at least partially concurrently with: (i) the first PA at a first duty cycle that is less than a first duty cycle threshold and at a first power level; and (ii) the second PA at a second duty cycle that is greater than both the first and a second duty cycle threshold at a second power level that is lower than the first power level, method 1100 ends. In response to determining that the first and the second PA are scheduled to transmit at least partially concurrently with: (i) the first PA at a first duty cycle that is less than a first duty cycle threshold and at a first power level; and (ii) the second PA at a second duty cycle that is greater than both the first and a second duty cycle threshold at a second power level that is lower than the first power level, method 1100 includes assigning and configuring a selected SMPS of the one or more SMPSs to power the second PA (block 1108). Method 1100 includes assigning and configuring a selected linear regulator of the one or more linear regulators to power the first PA (block 1110). Method 1100 includes configuring the power switching network to connect the selected linear regulator and the selected SMPS respectively to the first PA and the second PA (block 1112). Then method 1100 ends.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device, or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. A communication device comprising:
a battery supply;
a battery voltage sensor that detects an output voltage level of the battery supply;
a communication subsystem having a first number ("N1") of two or more power amplifiers (PAs) assignable to respective transmit uplinks;
a second number ("N2") of one or more switching mode power supplies (SMPSs) powered by the battery supply, N2 being less than N1;
a third number ("N3") of one or more linear regulators that are powered by one of (i) output voltage of the battery supply and (ii) one of the one or more SMPSs, wherein a sum of N2 and N3 is equal to or greater than N1 to enable powering all of the two or more PAs;
a power switching network; and
a controller communicatively coupled to the battery voltage sensor, the communication subsystem, and the one or more SMPSs, and which:
determines an average power tracking (APT) supply voltage value for each of the two or more PAs; and
assigns the one or more SMPSs and the one or more linear regulators to the one or more PAs to achieve a highest overall or combined system power efficiency.

2. The communication device of claim 1, wherein:
a power switching network configurable to couple to one of the battery supply, one of the one or more SMPSs, and one or more linear regulators to power each of the PAs, and further configurable to couple one of the output voltage of the battery supply and one of the SMPSs to power each of the one or more linear regulators; and
the controller:
assigns and configures the one or more SMPSs to power one or more of the two or more PAs;
assigns one or more linear regulators that are less power efficient than the one or more SMPSs to power a corresponding number of the two or more PAs not assigned to the one or more SMPSs; and
configures the power switching network to connect the assigned one or more SMPSs and one or more linear regulators to respective ones of the two or more PAs.

3. The communication device of claim 2, wherein the controller:
determines that a first and a second PA are scheduled to transmit non-concurrently;

identifies a first time and a subsequent second time that the first PA and the second PA are respectively scheduled to transmit;
prior to the first time that the first PA is scheduled to transmit:
assigns and configures a selected SMPS to power the first PA; and
configures the power switching network to connect the selected SMPS to the first PA; and
prior to the second time that the second PA is scheduled to transmit:
assigns and configures the selected SMPS to power the second PA; and
configures the power switching network to connect the selected SMPS to the second PA.

4. The communication device of claim 2, wherein:
the power switching network is further configurable to couple an output of the battery supply and one of the one or more SMPSs to power each of the one or more linear regulators; and
the controller, in response to determining that a first PA and a second PA are scheduled to transmit at least partially concurrently at different average power tracking values that are both greater than the output voltage level of the battery supply:
assigns and configures a selected SMPS of the one or more SMPSs to power the first PA that has a higher average power tracking value;
assigns and configures a selected linear regulator of the one or more linear regulators to power the second PA that has a lower average power tracking value; and
configures the power switching network to: (i) power the selected linear regulator from the selected SMPS; and (ii) connect the selected SMPS and the selected linear regulator respectively to the first PA and the second PA.

5. The communication device of claim 4, wherein the controller:
in response to determining that the first PA is transitioning to have a lower average power tracking value than the second PA:
assigns and configures the selected SMPS to power the second PA;
assigns and configures the selected linear regulator to power the first PA; and
configures the power switching network to switch the selected SMPS and the selected linear regulator respectively to the second PA and the first PA.

6. The communication device of claim 2, wherein:
the controller, in response to determining that a first PA and a second PA are scheduled to transmit at least partially concurrently at substantially equivalent average power tracking values:
assigns and configures a selected SMPS of the one or more SMPSs to power both of the first PA and the second PA; and
configures the power switching network to connect the selected SMPS to the first PA and the second PA.

7. The communication device of claim 2, wherein:
the power switching network is further configurable to couple an output of the battery supply and one of the one or more SMPSs to power each of one or more linear regulators; and
the controller, in response to determining that a first PA and a second PA are scheduled to transmit at least partially concurrently at different average power tracking values that are both lower than the output voltage level of the battery supply:
assigns and configures a selected SMPS of the one or more SMPSs to power the first PA that has a lower average power tracking value than the second PA;
assigns and configures a selected linear regulator of the one or more linear regulators to power the second PA; and
configures the power switching network to: (i) power the selected linear regulator from the output voltage level of the battery supply; and (ii) connect the selected SMPS and the selected linear regulator respectively to the first PA and the second PA.

8. The communication device of claim 2, wherein:
the power switching network is further configurable to couple an output of the battery supply and one of the one or more SMPSs to power each of one or more linear regulators; and
the controller, in response to determining that a first PA and a second PA are scheduled to transmit at least partially concurrently at different average power tracking values that are respectively greater than and lower than the output voltage level of the battery supply:
assigns and configures a selected SMPS of the one or more SMPSs to power the first PA that has a higher average power tracking value than the second PA;
assigns and configures a selected linear regulator of the one or more linear regulators to power the second PA; and
configures the power switching network to: (i) power the selected linear regulator from the output voltage of the battery supply; and (ii) connect the selected SMPS and the selected linear regulator respectively to the first PA and the second PA.

9. The communication device of claim 2, wherein:
the controller, in response to determining that a first PA and a second PA are scheduled to transmit at least partially concurrently with: (i) the first PA at a first duty cycle that is less than a first duty cycle threshold and at a first power level; and (ii) the second PA at a second duty cycle that is greater than both the first and a second duty cycle threshold at a second power level that is lower than the first power level:
assigns and configures a selected SMPS of the one or more SMPSs to power the second PA;
assigns and configures a selected linear regulator of the one or more linear regulators to power the first PA which would result in a highest average system efficiency using APT of the two or more PAs; and
configures the power switching network to connect the selected linear regulator and the selected SMPS respectively to the first PA and the second PA.

10. A method comprising:
detecting an output voltage level of a battery supply of a communication device that includes a communication subsystem having a first number ("N1") of two or more power amplifiers (PAs) assignable to respective transmit uplinks, a second number ("N2") of one or more switching mode power supplies (SMPSs) powered by the battery supply, N2 being less than N1, and a third number ("N3") of one or more linear regulators that are powered by one of (i) output voltage of the battery supply and (ii) one of the one or more SMPSs, wherein a sum of N2 and N3 is equal to or greater than N1 to enable powering all of the two or more PAs;
determining an average power tracking (APT) supply voltage value for each of two or more PAs; and assigning the one or more SMPSs and the one or more linear regulators to the one or more PAs to achieve highest overall or combined system power efficiency.

11. The method of claim 10, wherein:
assigning and configuring the one or more SMPSs to power one or more of the two or more PAs;
assigning one or more linear regulators that are less power efficient than the one or more SMPSs to power a corresponding number of the two or more PAs not assigned to the one or more SMPSs; and
configuring a power switching network of the communication device to connect the assigned one or more SMPSs and one or more linear regulators to respective ones of the two or more PAs.

12. The method of claim 11, further comprising:
determining that a first and a second PA are scheduled to transmit non-concurrently;
identifying a first time and a subsequent second time that the first PA and the second PA are respectively scheduled to transmit; and
prior to the first time that the first PA is scheduled to transmit:
  assigning and configuring a selected SMPS to power the first PA; and
  configuring the power switching network to connect the selected SMPS to the first PA; and
prior to the second time that the second PA is scheduled to transmit:
  assigning and configuring the selected SMPS to power the second PA; and
  configuring the power switching network to connect the selected SMPS to the second PA.

13. The method of claim 11, further comprising:
in response to determining that a first PA and a second PA are scheduled to transmit at least partially concurrently at different average power tracking values that are both greater than the output voltage level of the battery supply:
  assigning and configuring a selected SMPS of the one or more SMPSs to power the first PA that has a higher average power tracking value;
  assigning and configuring a selected linear regulator of the one or more linear regulators to power the second PA that has a lower average power tracking value; and
  configuring the power switching network to: (i) power the selected linear regulator from the selected SMPS; and (ii) connect the selected SMPS and the selected linear regulator respectively to the first PA and the second PA.

14. The method of claim 13, further comprising:
in response to determining that the first PA is transitioning to have a lower average power tracking value than the second PA:
  assigning and configuring the selected SMPS to power the second PA;
  assigning and configuring the selected linear regulator to power the first PA; and
  configuring the power switching network to switch the selected SMPS and the selected linear regulator respectively to the second PA and the first PA.

15. The method of claim 11, further comprising:
in response to determining that a first PA and a second PA are scheduled to transmit at least partially concurrently at substantially equivalent average power tracking values:
  assigning and configuring a selected SMPS of the one or more SMPSs to power both of the first PA and the second PA; and
  configuring the power switching network to connect the selected SMPS to the first PA and the second PA.

16. The method of claim 11, further comprising:
in response to determining that a first PA and a second PA are scheduled to transmit at least partially concurrently at different average power tracking values that are both lower than the output voltage level of the battery supply:
  assigning and configuring a selected SMPS of the one or more SMPSs to power the first PA that has a lower average power tracking value than the second PA;
  assigning and configuring a selected linear regulator of the one or more linear regulators to power the second PA; and
  configuring the power switching network to: (i) power the selected linear regulator from the output voltage level of the battery supply; and (ii) connect the selected SMPS and the selected linear regulator respectively to the first PA and the second PA.

17. The method of claim 11, wherein:
in response to determining that a first PA and a second PA are scheduled to transmit at least partially concurrently at different average power tracking values that are respectively greater than and lower than the output voltage level of the battery supply:
  assigning and configuring a selected SMPS of the one or more SMPSs to power the first PA that has a higher average power tracking value than the second PA;
  assigning and configuring a selected linear regulator of the one or more linear regulators to power the second PA; and
  configuring the power switching network to: (i) power the selected linear regulator from the output voltage of the battery supply; and (ii) connect the selected SMPS and the selected linear regulator respectively to the first PA and the second PA.

18. The method of claim 11, wherein:
in response to determining that a first PA and a second PA are scheduled to transmit at least partially concurrently with: (i) the first PA at a first duty cycle that is less than a first duty cycle threshold and at a first power level; and (ii) the second PA at a second duty cycle that is greater than both the first and a second duty cycle threshold at a second power level that is lower than the first power level:
  assigning and configuring a selected SMPS of the one or more SMPSs to power the second PA;
  assigning and configuring a selected linear regulator of the one or more linear regulators to power the first PA; and
  configuring the power switching network to connect the selected linear regulator and the selected SMPS respectively to the first PA and the second PA.

19. A computer program product comprising:
a computer readable storage device; and
program code on the computer readable storage device that when executed by a processor associated with a communication device, the program code enables the communication device to provide functionality of:
  detecting an output voltage level of a battery supply of a communication device that includes a communication subsystem having a first number ("N1") of two or more power amplifiers (PAs) assignable to respective transmit uplinks, a second number ("N2") of one or more switching mode power supplies (SMPSs) powered by the battery supply, N2 being less than N1, and a third number ("N3") of one or more linear regulators that are powered by one of (i) output voltage of the battery supply and (ii) one of the one or more SMPSs, wherein a sum of N2 and N3 is equal to or greater than N1 to enable powering all of the two or more PAs;

determining an average power tracking (APT) supply voltage value for each of two or more PAs; and assigning the one or more SMPSs and the one or more linear regulators to the one or more PAS to achieve a highest overall or combined system power efficiency.

20. The computer program product of claim 19, wherein the program code enables the communication device to provide the functionality of:

assigning and configuring the one or more SMPSs to power one or more of the two or more PAs having higher power requirements that benefit most from APT;

assigning one or more linear regulators that are less power efficient than the one or more SMPSs to power a corresponding number of the two or more PAs not assigned to the one or more SMPSs; and configuring a power switching network of the communication device to connect the assigned one or more SMPSs and one or more linear regulators to respective ones of the two or more PAs.

\* \* \* \* \*